(12) United States Patent
Song

(10) Patent No.: US 12,101,142 B2
(45) Date of Patent: Sep. 24, 2024

(54) METHOD, DEVICE AND COMPUTER READABLE MEDIUM OF COMMUNICATION

(71) Applicant: NOKIA TECHNOLOGIES OY, Espoo (FI)

(72) Inventor: Nuan Song, Shanghai (CN)

(73) Assignee: NOKIA TECHNOLOGIES OY, Espoo (FI)

( * ) Notice: Subject to any disclaimer, the term of this patent is extended or adjusted under 35 U.S.C. 154(b) by 188 days.

(21) Appl. No.: 17/786,070

(22) PCT Filed: Jan. 14, 2020

(86) PCT No.: PCT/CN2020/072076
§ 371 (c)(1),
(2) Date: Jun. 16, 2022

(87) PCT Pub. No.: WO2021/142631
PCT Pub. Date: Jul. 22, 2021

(65) Prior Publication Data
US 2023/0040739 A1    Feb. 9, 2023

(51) Int. Cl.
*H04B 7/02* (2018.01)
*H04B 7/0456* (2017.01)

(52) U.S. Cl.
CPC .................. *H04B 7/0456* (2013.01)

(58) Field of Classification Search
CPC .................................... H04B 7/0456
(Continued)

(56) References Cited

U.S. PATENT DOCUMENTS

| 2018/0102822 A1 | 4/2018 | Noh et al. |
| 2021/0099210 A1* | 4/2021 | Ramireddy ........... H04L 25/022 |
| 2022/0255604 A1* | 8/2022 | Wu ....................... H04L 1/1614 |

FOREIGN PATENT DOCUMENTS

| CN | 107113034 A | 8/2017 |
| CN | 107666339 A | 2/2018 |

(Continued)

OTHER PUBLICATIONS

International Search Report and Written Opinion dated Oct. 16, 2020 corresponding to International Patent Application No. PCT/CN2020/072076.

(Continued)

*Primary Examiner* — Zewdu A Kassa
(74) *Attorney, Agent, or Firm* — SQUIRE PATTON BOGGS (US) LLP

(57) ABSTRACT

Embodiments of the present disclosure relate to methods, devices and computer readable storage media of communication. A network device transmits, to a terminal device, channel state information reference signals associated with first number of ports at the network device; receives, from the terminal device, compressed channel state information generated based on capability of the terminal device; and recoveries, from the compressed channel state information, channel state information associated with second number of ports at the network device, the second number of ports being not less than the first number of ports. The terminal device receives, from the network device, the channel state information reference signals associated with the first number of ports at the network device; determines channel state information based on the channel state information reference signals; compresses the channel state information based on capability of the terminal device; and transmits the compressed channel state information to the network device for recovery of the channel state information associated with the (Continued)

second number of ports. As such, CSI can be acquired more accurately with reduced complexity and overhead.

22 Claims, 9 Drawing Sheets

(58) Field of Classification Search
USPC .......... 375/267, 260, 259, 219, 295, 316
See application file for complete search history.

(56) References Cited

FOREIGN PATENT DOCUMENTS

| | | |
|---|---|---|
| CN | 109428639 A | 3/2019 |
| CN | 110622433 A | 12/2019 |
| EP | 3471307 A2 | 4/2019 |
| WO | 2017/078798 A1 | 5/2017 |
| WO | 2019/028878 A1 | 2/2019 |
| WO | 2019/066676 A1 | 4/2019 |
| WO | 2019237344 A1 | 12/2019 |

OTHER PUBLICATIONS

Huawei et al., "Discussion on reciprocity based DL CSI feedback," R1-1701683, 3GPP TSG RAN WG1 Meeting #88, Athens, Greece, Feb. 17, 2017.

Extended European Search Report dated Sep. 13, 2023, corresponding to European Patent Application No. 20913800.7.

ZTE: "Discussion on CSI-RS and CSI enhancement for EBF/FD-MIMO", 3GPP Draft; R1-151747 CSI-RS and CSI Feedback Enhancements, 3rd Generation Partnership Project (3GPP), Mobile Competence Centre ; 650, Route Des Lucioles ; F-06921 Sophia-Antipolis Cedex ; France, vol. RAN WG1, No. Belgrade, Serbia; Apr. 11, 2015.

SAMSUNG: "Advanced CSI feedback for NR", 3GPP Draft; R1-1612502 Advanced CSI Feedback for NR, 3rd Generation Partnership Project (3GPP), Mobile Competence Centre ; 650, Route Des Lucioles ; F-06921 Sophia-Antipolis Cedex ; France, vol. RAN WG1, No. Reno, USA; Nov. 13, 2016.

Rahman MD Saifur et al: "CSI feedback based on space-frequency compression", 2020 IEEE 17th Annual Consumer Communications & Networking Conference (CCNC), IEEE, Jan. 10, 2020 (Jan. 10, 2020), pp. 1-6.

* cited by examiner

METHOD, DEVICE AND COMPUTER READABLE MEDIUM OF COMMUNICATION

FIELD

Embodiments of the present disclosure generally relate to the field of telecommunication and in particular, to methods, devices and computer readable storage media of communication in massive multiple-input multiple-output (MIMO) systems.

BACKGROUND

In massive MIMO systems, in particular, operated in frequency division multiplexing (FDD) mode at millimeter wave (mmWave) frequencies, acquiring accurate channel state information (CSI) is of prime interest for a beamforming or precoding design to achieve a throughput boost brought by the large number of antennas. As the number of antenna ports is increasingly larger, a crucial problem during CSI acquisition is the large overhead rising from transmission of the large number of CSI reference signals (CSI-RSs) and feedback of the large number of CSI.

The mmWave MIMO channels with double-directional modeling exhibit a spatially sparse nature. In view of this, the related CSI in a massive MIMO system can be compressed at least in the spatial domain to reduce the CSI feedback overhead. Currently, it is highly concerned to achieve overhead reduction in CSI acquisition procedure for massive MIMO with a good performance.

SUMMARY

In general, example embodiments of the present disclosure provide a solution for CSI acquisition.

In a first aspect, there is provided a method of communication. The method comprises: transmitting, at a network device and to a terminal device, channel state information reference signals associated with first number of ports at the network device; receiving, from the terminal device, compressed channel state information generated based on capability of the terminal device; and recovering, from the compressed channel state information, channel state information associated with second number of ports at the network device, the second number of ports being not less than the first number of ports.

In a second aspect, there is provided a method of communication. The method comprises: receiving, at a terminal device and from a network device, channel state information reference signals associated with first number of ports at the network device; determining channel state information based on the channel state information reference signals; compressing the channel state information based on capability of the terminal device; and transmitting the compressed channel state information to the network device for recovery of channel state information associated with a second number of ports at the network device, the second number of ports being not less than the first number of ports.

In a third aspect, there is provided a network device. The network device comprises: at least one processor; and at least one memory including computer program codes; the at least one memory and the computer program codes are configured to, with the at least one processor, cause the network device to perform the method according to the first aspect.

In a fourth aspect, there is provided a terminal device. The terminal device comprises: at least one processor; and at least one memory including computer program codes; the at least one memory and the computer program codes are configured to, with the at least one processor, cause the terminal device to perform the method according to the second aspect.

In a fifth aspect, there is provided a non-transitory computer readable medium. The non-transitory computer readable medium comprises program instructions for causing an apparatus to perform the method according to the first aspect.

In a sixth aspect, there is provided a non-transitory computer readable medium. The non-transitory computer readable medium comprises program instructions for causing an apparatus to perform the method according to the second aspect.

It is to be understood that the summary section is not intended to identify key or essential features of embodiments of the present disclosure, nor is it intended to be used to limit the scope of the present disclosure. Other features of the present disclosure will become easily comprehensible through the following description.

BRIEF DESCRIPTION OF THE DRAWINGS

Some example embodiments will now be described with reference to the accompanying drawings, where.

Throughout the drawings, the same or similar reference numerals represent the same or similar element.

DETAILED DESCRIPTION

Figure 1:
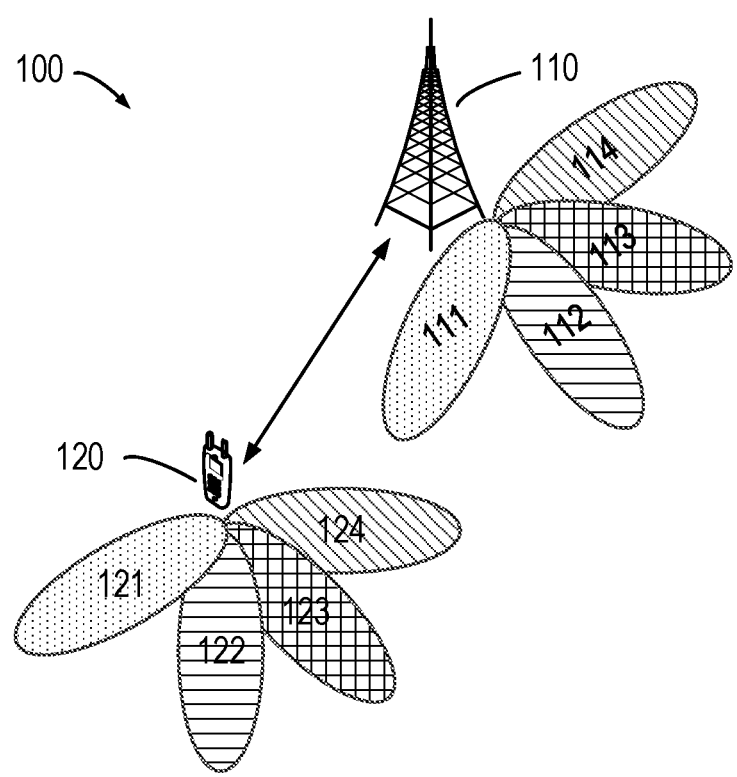
FIG. 1 illustrates an example communication network in which example embodiments of the present disclosure may be implemented.

Principle of the present disclosure will now be described with reference to some example embodiments. It is to be understood that these embodiments are described only for the purpose of illustration and help those skilled in the art to understand and implement the present disclosure, without suggesting any limitation as to the scope of the disclosure. The disclosure described herein can be implemented in various manners other than the ones described below.

In the following description and claims, unless defined otherwise, all technical and scientific terms used herein have the same meaning as commonly understood by one of ordinary skills in the art to which this disclosure belongs.

References in the present disclosure to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the listed terms.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

As used in this application, the term "circuitry" may refer to one or more or all of the following:
 (a) hardware-only circuit implementations (such as implementations in only analog and/or digital circuitry) and
 (b) combinations of hardware circuits and software, such as (as applicable):
  (i) a combination of analog and/or digital hardware circuit(s) with software/firmware and
  (ii) any portions of hardware processor(s) with software (including digital signal processor(s)), software, and memory(ies) that work together to cause an apparatus, such as a mobile phone or server, to perform various functions) and
 (c) hardware circuit(s) and or processor(s), such as a microprocessor(s) or a portion of a microprocessor(s), that requires software (e.g., firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

As used herein, the term "communication network" refers to a network following any suitable communication standards, such as Long Term Evolution (LTE), LTE-Advanced (LTE-A), Wideband Code Division Multiple Access (WCDMA), High-Speed Packet Access (HSPA), Narrow Band Internet of Things (NB-IoT) and so on. Furthermore, the communications between a terminal device and a network device in the communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future. Embodiments of the present disclosure may be applied in various communication systems. Given the rapid development in communications, there will of course also be future type communication technologies and systems with which the present disclosure may be embodied. It should not be seen as limiting the scope of the present disclosure to only the aforementioned system.

As used herein, the term "network device" refers to a node in a communication network via which a terminal device accesses the network and receives services therefrom. The network device may refer to a base station (BS) or an access point (AP), for example, a node B (NodeB or NB), an evolved NodeB (eNodeB or eNB), a NR NB (also referred to as a gNB), a Remote Radio Unit (RRU), a radio header (RH), a remote radio head (RRH), a relay, a low power node such as a femto, a pico, and so forth, depending on the applied terminology and technology.

The term "terminal device" refers to any end device that may be capable of wireless communication. By way of example rather than limitation, a terminal device may also be referred to as a communication device, user equipment (UE), a Subscriber Station (SS), a Portable Subscriber Station, a Mobile Station (MS), or an Access Terminal (AT). The terminal device may include, but not limited to, a mobile phone, a cellular phone, a smart phone, voice over IP (VoIP) phones, wireless local loop phones, a tablet, a wearable terminal device, a personal digital assistant (PDA), portable computers, desktop computer, image capture terminal devices such as digital cameras, gaming terminal devices, music storage and playback appliances, vehicle-mounted wireless terminal devices, wireless endpoints, mobile stations, laptop-embedded equipment (LEE), laptop-mounted equipment (LME), USB dongles, smart devices, wireless customer-premises equipment (CPE), an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. In the following description, the terms "terminal device", "communication device", "terminal", "user equipment" and "UE" may be used interchangeably.

FIG. 1 illustrates an example communication network 100 in which embodiments of the present disclosure can be implemented. As shown in FIG. 1, the network 100 includes a network device 110 and a terminal device 120 served by the network device 110. It is to be understood that the number of network devices and terminal devices as shown in FIG. 1 is only for the purpose of illustration without suggesting any limitations. The network 100 may include any suitable number of network devices and terminal devices adapted for implementing embodiments of the present disclosure.

As shown in FIG. 1, the network device 110 and the terminal device 120 may communicate with each other. The network device 110 may have multiple antennas for communication with the terminal device 120. For example, the network device 110 may include four antennas 111, 112, 113, and 114. The terminal device 120 may also have multiple antennas for communication with the network device 110. For example, the terminal device 120 may include four antennas 121, 122, 123, and 124. It is to be understood that the number of antennas as shown in FIG. 1 is only for the purpose of illustration without suggesting any limitations. Each of the network device 110 and the terminal device 120 may provide any suitable number of antennas adapted for implementing embodiments of the present disclosure.

The communications in the network 100 may conform to any suitable standards including, but not limited to, LTE, LTE-evolution, LTE-advanced (LTE-A), wideband code division multiple access (WCDMA), code division multiple access (CDMA) and global system for mobile communications (GSM) and the like. Furthermore, the communications may be performed according to any generation communication protocols either currently known or to be developed in the future. Examples of the communication protocols include, but not limited to, the first generation (1G), the second generation (2G), 2.5G, 2.75G, the third generation (3G), the fourth generation (4G), 4.5G, the fifth generation (5G) communication protocols.

A plurality of channels or sub-channels may be established between the network device 110 and the terminal device 120 via the multiple antennas 111, 112, 113 and 114 and the multiple antennas 121, 122, 123, and 124 for data transmission. To achieve a throughput boost brought by the large number of antennas, accurate CSI associated with the plurality of channels or sub-channels needs to be acquired for beamforming or precoding design in the data transmission. During CSI acquisition, the network device 110 may transmit a CSI-RS to the terminal device 120 via each of the channels or sub-channels, and the terminal device 120 may measure CSI on each of the channels or sub-channels based on the received CSI-RS and transmit the measured CSI to the network device 110.

For example, assuming that the network device 110 is mounted with $M_T$ transmit antenna ports. The network device 110 simultaneously serves K terminal devices 120, where each terminal device 120 has $M_{R_k}$ receive antennas. The complete channel considered in the system is denoted by $H \in C^{M_R \times M_T}$, where $M_R = \Sigma_{k=1}^{K} M_{R_k}$ is the total number of receive antennas from all terminal devices 120. The mmWave channel is represented by the widely used clustered model, represented by $H_k$ for the k-th terminal device 120. The network device 110 requires the CSI $H=[H^{(1)}, H^{(2)}, \ldots, H^{(K)}]$ to design the transmit processing such as precoding for K terminal devices 120. In FDD system, the downlink channel H can be obtained via the feedback of CSI estimated at terminal devices 120.

As the number of antennas is increasingly larger, the CSI to be estimated at the terminal device 120 has a large dimension and accordingly a large CSI-RS overhead is required in the downlink. On the other hand, once the terminal device 120 obtains the downlink CSI-RS, to feedback the whole explicit CSI will improve the MIMO transmission performance but also lead to a significantly large overhead.

In some conventional solutions, the network device 110 may transmit non-precoded CSI-RSs to the terminal device 120, and the terminal device 120 may determine CSI by estimating the channels or sub-channels based on the non-precoded CSI-RSs. The terminal device 120 may compress the CSI to remove the unnecessary redundancy by using, e.g., principal component analysis (PCA) or orthogonal matching pursuit (OMP), and transmit the compressed CSI to the network device 110. The network device 110 may receive the compressed CSI and carry out the reconstruction of the compressed CSI. In this way, the CSI feedback overhead may be reduced. However, the disadvantage of this solution is a large amount of transmit CSI-RS due to many antenna ports and the consistent feedback of the compression information such as compression matrices or indices of the corresponding codebooks used for reconstruction at the network device 110. This will lead to a large overhead of both the transmit CSI-RS and the feedback.

In some yet conventional solutions, the network device 110 may transmit beamformed CSI-RS using, e.g., grid of beam (GoB) to the terminal device 120, and the terminal device 120 may estimate the beamformed CSI-RS and feed back the beamformed CSI with a reduced dimension, along with a CSI-RS resource indicator (CRI). This reduces the overhead of both the CSI-RS transmission and the feedback. However, the network device 110 needs to design a "second-stage" precoding for the obtained beamformed CSI to map layers to ports. In this way, the performance will be limited by the selection of beams for the beamformed CSI-RS, since the precoding design is split into two parts, which one is the "second-stage" precoding and the other one is the port virtualization.

In some still conventional solutions, the above two solutions are combined to utilize the beamformed CSI-RS at the network device 110 and carry out the CSI compression at the terminal device 120. In this way, the overhead is largely reduced, but the network device 110 still need to design the "second-stage" precoding for the obtained beamformed CSI to map layers to ports. It is disadvantageous for an improvement of the MIMO transmission performance and complexity.

The inventor notes that, the mmWave MIMO channels with double-directional modeling exhibit a spatially sparse nature. The related CSI in a massive MIMO system can be compressed at least in the spatial domain to reduce the CSI feedback overhead. One popular solution is to apply compressed censing (CS) formulation at the terminal device 120 and the network device 110 can simply reconstructs the CSI from the compressed CSI feedback. In future mobile communications, it requires the terminal device 120 to have low power consumption and a low complexity due to the demanding new functionalities, while the network device 110 could be more powerful. It is thus still highly desired to shift the computational efforts from the terminal device 120 to the network device 110.

Figure 2:
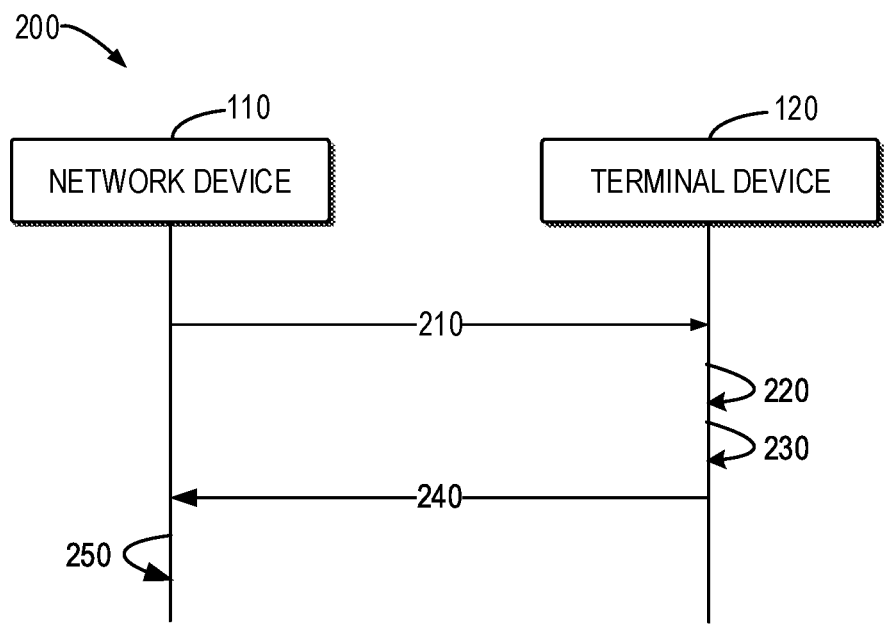
FIG. 2 illustrates a flowchart illustrating a process of communication during CSI acquisition according to some embodiments of the present disclosure.

In order to solve the above and other potential problems, embodiments of the present disclosure provide an improved solution of CSI acquisition based on machine learning (ML), the mechanism of which is illustrated in a high-level flow-chart as shown in FIG. 2.

FIG. 2 illustrates a flowchart 200 illustrating a process of communication during CSI acquisition according to some embodiments of the present disclosure. The network device 110 transmits 210 CSI-RSs associated with a first number of ports at the network device 110 to the terminal device 120. Upon receipt of the CSI-RSs, the terminal device 120 determines 220 related CSI based on channel measurement for the CSI-RSs. Upon determining the CSI, the terminal device 120 compress 230 the CSI, and transmits 240 the compressed CSI to the network device 110. Upon receiving the compressed CSI, the network device 110 recovery 250, from the compressed CSI, CSI associated with a second number of ports at the network device 110. The second number of ports is not less than the first number of ports, that is, the second number of ports is equal to or higher than the first number of ports.

It is to be understood that the ports herein may refer to virtual ports in port virtualization. In some embodiments, the second number of ports may be equal to a total number of ports at the network device 110. In some alternative embodiments, the second number of ports may be less than the total number of ports at the network device 110. Compared to the conventional solutions, the present solution can recovery CSI with more ports than the number of ports for CSI feedback based on a predetermined ML model, without requiring the CRI-like feedback, and thus CSI can be acquired more accurately with reduced complexity and overhead.

Some example embodiments of the present disclosure will now be described in detail with reference to the figures. However, those skilled in the art would readily appreciate that the detailed description given herein with respect to these figures is for explanatory purpose as the present disclosure extends beyond theses limited embodiments.

Figure 3:
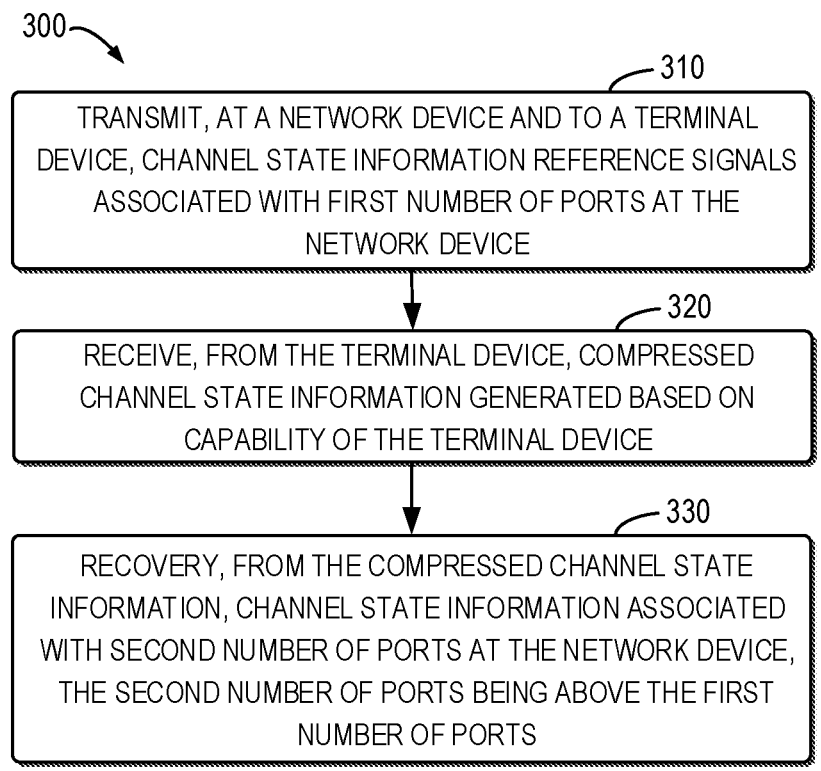
FIG. 3 illustrates a flowchart of a method of communication implemented at a network device according to example embodiments of the present disclosure.

FIG. 3 illustrates a flowchart of a method 300 of communication implemented at a network device according to example embodiments of the present disclosure. The method 300 can be implemented at the network device 110 shown in FIG. 1. For the purpose of discussion, the method 300 will be described with reference to FIG. 1. It is to be understood that method 300 may further include additional blocks not shown and/or omit some shown blocks, and the scope of the present disclosure is not limited in this regard.

As shown in FIG. 3, at block 310, the network device 110 transmits, to the terminal device 120, CSI-RSs associated with first number of ports at the network device 110. In some embodiments, the network device 110 may compress the CSI-RSs and transmit the compressed CSI-RSs to the terminal device 120. In this case, the first number of ports may less than the total number of ports at the network device 110. In some embodiments, the network device 110 may compress the CSI-RSs based on antenna characteristics at the network device 110. In some example embodiments, the network device 110 may compress the CSI-RSs based on array response at the network device 110.

For example, if the number of transmit antennas ports is $M_T$, a spatial compression matrix $F \in \mathbb{C}^{M_R \times M_T}$ is applied, where $N_T < M_T$ holds by assuming that the spatial redundancy exists at the transmitter of the network device 110. The network device 110 only needs to send $N_T$ CSI-RSs instead of $M_T$, which reduces the CSI-RS overhead.

An example to design the transmit compression matrix F will be described now. Since the network device 110 does not know the angle(s) of arrivals from the terminal device 120 or multiple terminal devices, a large range is divided into $N_T$ intervals, and apply discrete prolate spheroidal sequences (DPSS) beamspace beamforming within each angle interval. The semi-definite matrix for the DPSS method for the n-th angle interval with n=1, . . . , $N_T$ is defined as $$J_n^{gNB} = \int_{\Theta_n} \int_{\Phi_n} a_{gNB}(\theta,\varphi) a_{gNB}^N(\theta,\varphi) d\theta d\varphi, \tag{1}$$

where $\Theta_n$ and $\Phi_n$ are the angular regions of interest in two dimensions and $a_{gNB}(\theta, \varphi)$ is the array response at the sampling point $(\theta, \varphi)$. By applying the eigen value decomposition (EVD) on equation (2), $$J_n^{gNB} = U_n \Sigma_n U_n^H \tag{2}$$

the original DPSS beamspace matrix $F_n$ can be obtained by summing up (equally combining) the eigenvectors that span the sampled region of interest, written as $$F_n = \sum_{m=1}^{M_T} U_n(:,m). \tag{3}$$

The matrix for measurement of the static beam can be written as $F=[F_1, F_2, \ldots, F_{N_T}]$. Since this beamforming matrix for the measurement only depends on the array response at the network device 110, it is considered as "static". It should be noted that the above example is merely for illustration, and other antenna characteristics than the array response also can be applied to design the transmit compression matrix, and other forms of matrix also can be employed. In this way, quasi-static compression/operation for the CSI-RS at the network device 110 exhibits specific "beam" pattern, and does not require any beam selection at the terminal device 120 side, and also does not need CRI feedback from the terminal device 120.

In some alternative embodiments, the network device 110 may transmit original or non-compressed CSI-RSs. In this case, the first number of ports may equal to the total number of ports at the network device 110. In these embodiments, the network device 110 may further transmit, to the terminal device 120, information about transmit compression so as to be utilized for compression of CSI at the terminal device 120, which will be described later in connection with FIGS. 5 and 6. For example, the network device 110 may transmit information about transmit compression matrix F. It should be noted that any other suitable forms of information about transmit compression also can be used.

At block 320, the network device 110 receives, from the terminal device 120, compressed CSI (for example, $Y^{(k)}$ where k represents $k_{th}$ terminal device). According to embodiments of the present disclosure, the compressed CSI is generated based on capability of the terminal device 120. In some embodiments, a mode of compression of the compressed CSI may be divided into a first compression mode that is ML friendly with a common codebook and a second compression mode that is not ML friendly with a common codebook.

In some embodiments in which the terminal device 120 enables the first compression mode, the compressed CSI may be generated based on antenna characteristics at the terminal device 120 with the common codebook. The codebook should be accurately defined to meet the compression requirements. The compression does not vary with the dynamic channel propagation characteristics but may vary with different antenna patterns for different terminal devices. This is simple for the ML enabled CSI recovery with a good performance. In some embodiments in which the terminal device 120 enables the second compression mode, the compressed CSI may be generated based on channel propagation characteristics at the terminal device 120 with a unique codebook. As to the compression associated with the compressed CSI, other details will be described later in connection with FIGS. 5 and 6.

Upon receiving the compressed CSI, at block 330, the network device 110 recoveries, from the compressed CSI, CSI (for example, $H^{(k)}$ where k represents $k_{th}$ terminal device) associated with second number of ports at the network device 110. According to embodiments of the present disclosure, the second number of ports is not less than the first number of ports. In some embodiments, the second number of ports may be equal to the total number of ports at the network device 110. In some alternative embodiments, the second number of ports may be less than the total number of ports at the network device 110.

Figure 4:
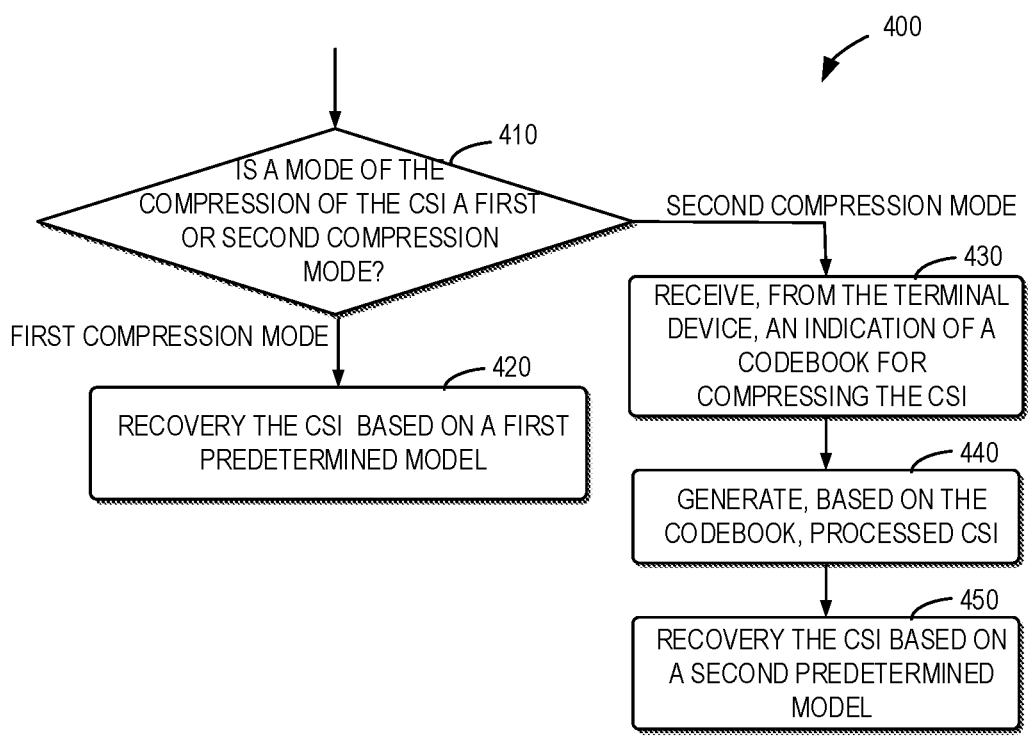
FIG. 4 illustrates a flowchart of an example method of CSI recovery according to example embodiments of the present disclosure.

According to embodiments of the present disclosure, the network device 110 may recovery, from the compressed CSI, the CSI associated with the second number of ports based on a predetermined ML model. Different models may be employed for different compression modes associated with the compressed CSI. It will be described below in connection with FIG. 4. FIG. 4 illustrates a flowchart of an example method 400 of CSI recovery according to example embodiments of the present disclosure. The method 400 can be implemented at the network device 110 shown in FIG. 1. For the purpose of discussion, the method 400 will be described with reference to FIG. 1. It is to be understood that method 400 may further include additional blocks not shown and/or omit some shown blocks, and the scope of the present disclosure is not limited in this regard.

At block 410, the network device 110 may determine whether the mode is the first or second compression mode. Upon receiving the compressed CSI, the network device 110 may determine a mode of compression of the compressed CSI. In some embodiments, the mode may be decided or triggered by the terminal device 120. In this case, the network device 110 may receive an indicator representing the mode from the terminal device 120 and determine the mode based on the indicator. For example, in some embodiments, the network device 110 may receive the indicator in a physical uplink control channel (PUCCH). In some embodiments, the network device 110 may receive the indicator together with the compressed CSI. It should be noted that the transmission of the indicator from the terminal device 120 can be carried out in any other suitable ways and does not limited by the above example.

In some alternative embodiments, the mode may be decided or triggered by the network device 110. In some embodiments, the network device 110 may receive information about capability of the terminal device 120 from the terminal device 120 and determine the mode based on the capability of the terminal device 120. For example, in some embodiments where the terminal device 120 enables the first compression mode, the network device 110 may determine the mode as the first compression mode. In some embodiments where the terminal device 120 does not enable the first compression mode, the network device 110 may determine the mode as the second compression mode.

In these embodiments where the mode is decided by the network device 110, the network device 110 may further transmit an indicator representing the mode to the terminal device 120 for CSI compression. For example, in some embodiments, the network device 110 may transmit the indicator in a physical downlink control channel (PDCCH). In some embodiments, the network device 110 may transmit the indicator together with the CSI-RS. It should be noted that the transmission of the indicator from the network device 110 can be carried out in any other suitable ways and does not limited by the above example.

With reference to FIG. 4, if determining at block 410 that the mode is the first compression mode, the network device 110 may, at block 420, recovery the CSI associated with the second number of ports based on a first predetermined model mapping the compressed CSI to the CSI associated with the second number of ports. In some embodiments, with $\mathcal{y}^{(k)} \in C_R^{N} {}^{xN_T}{}^{x2}$ as an input of the first predetermined model, can be obtained as an output. $\mathcal{y}^{(k)} \in C_R^{N} {}^{xN_T}{}^{x2}$ is the tensor notation for the matrix $Y^{(k)}$ by concatenating its real and imaginary parts in the third dimension.

According to embodiments of the present disclosure, the first predetermined model may be generated in advance by training a neural network with a large amount of compressed CSI as an input and corresponding known exact CSI as an output. During the training procedure, all possible codebook cases for the CSI compression are considered as the input, so that the first predetermined model for CSI recovery would not be restricted for a specific terminal device. It is to be understood that the first predetermined model can be obtained by any suitable neural network training ways, and the present disclosure does not make limitation for this.

If determining at block 410 that the mode is the second compression mode, the network device 110 may, at block 430, receive an indication of a codebook (for example, $W^{(k)}$ where k represents $k_{th}$ terminal device) for compressing the CSI from the terminal device 120. The indication may be carried out in any suitable way. The feedback of the indication of the codebook does not impose a large overhead, since the size of the codebook is small, which is only restricted by the number of antennas at the terminal device 120 and related to the receive compression.

At block 440, the network device 110 may generate processed CSI (for example, $y_{rec}^{(k)}$) based on the codebook. For example, in some embodiments, the compressed CSI $Y^{(k)}$ may be processed by vectorizing the compressed CSI $Y^{(k)}$, written as $$y^{(k)} = \text{vec}(Y^{(k)}) = \text{vec}(W^{(k)}H^{(k)}F) = (F^T \otimes W^{(k)H})\text{vec}(H^{(k)}). \quad (4)$$

where $Y^{(k)}$ represents the compressed CSI associated with $k_{th}$ terminal device, $y^{(k)}$ represents the vectorized compressed CSI associated with $k_{th}$ terminal device, $W^{(k)}$ represents the receive compression matrix associated with $k_{th}$ terminal device, $H^{(k)}$ represents the exact channel matrix associated with $k_{th}$ terminal device, and F represents the transmit compression matrix. Then the processed CSI may be obtained by Least Squares (LS)

$$y_{rec}^{(k)} = \text{vec}(H^{(k)}) = (F^T \otimes W^{(k)H})^{-1} y^{(k)} y^{(k)} \in C^{M_T M}{}_{th} \quad (5)$$

where $y_{rec}^{(k)}$ represents the processed CSI, $Y^{(k)}$ is the compressed CSI associated with $k_{th}$ terminal device, $W^{(k)}$ represents the receive compression matrix associated with $k_{th}$ terminal device, $H^{(k)}$ represents the exact channel matrix associated with $k_{th}$ terminal device, F represents the transmit compression matrix, $M_{R_k}$ represents the number of receive antenna ports at the terminal device 120 and $M_T$ represents the number of transmit antenna ports at the network device 110.

It should be note that the above-listed equations are provided merely for illustration, and are not intended to limit the present application, and any other suitable implementations can be adopted.

At block 450, the network device 110 may recovery the CSI (for example, $H^{(k)}$) associated with the second number of ports based on a second predetermined model mapping the processed CSI to the CSI associated with the second number of ports. In some embodiments, the processed CSI may be further processed by reformulating the real and imaginary part of $y_{rec}^{(k)}$ into a tensor notation $\mathcal{Y}_{rec}^{(k)} \in \mathbb{C}^{M_{R_k} \times M_T \times 2}$ so as to be an input to the second predetermined model. Then, the CSI associated with the second number of ports can be obtained as an output of the second predetermined model.

According to embodiments of the present disclosure, the second predetermined model may be generated in advance by training a neural network with a large amount of processed CSI as an input and corresponding known exact CSI as an output, the processed CSI being generated from compressed CSI and based on the indication of the codebook. It is to be understood that the second predetermined model can be obtained by any suitable neural network training ways, and the present disclosure does not make limitation for this.

An example implementation at the network device 110 has been described above with reference to FIGS. 3 and 4. In this way, the CSI of the uncompressed dimension can be recovered from the CSI feedback with a limited number of ports, enabled by neural networks trained for two modes. Correspondingly, an example implementation at the terminal device 120 will be described now with reference to FIGS. 5 and 6.

Figure 5:
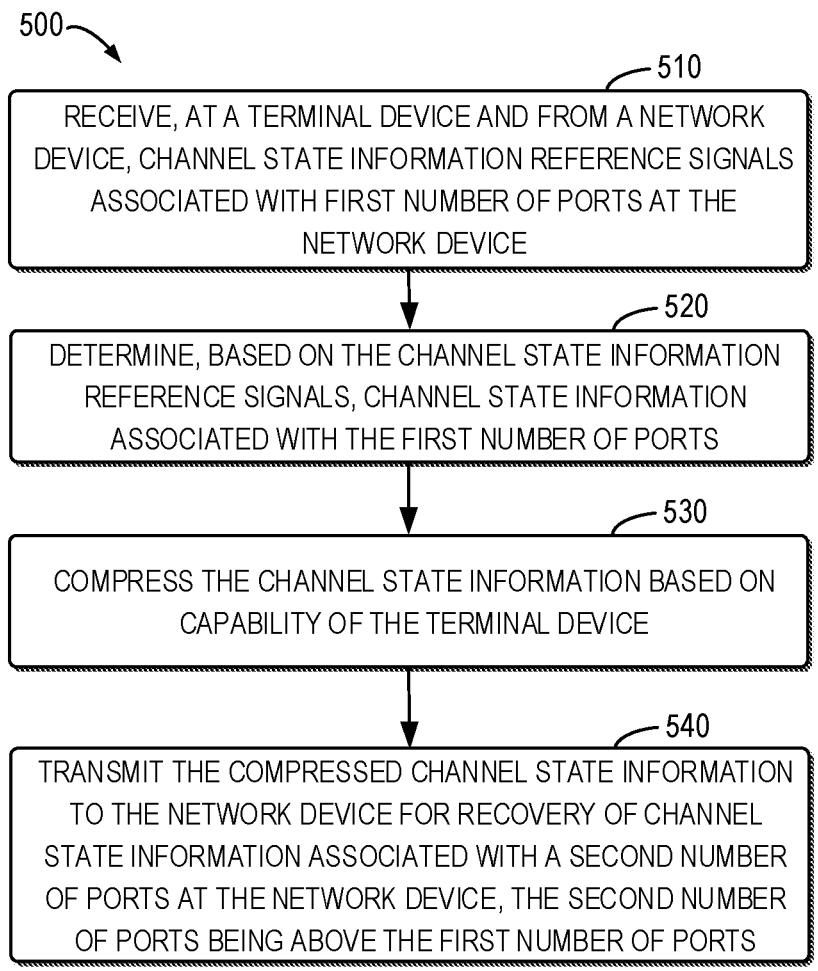
FIG. 5 illustrates a flowchart of a method of communication implemented at a terminal device according to example embodiments of the present disclosure.

FIG. 5 illustrates a flowchart of a method 500 of communication implemented at a terminal device according to example embodiments of the present disclosure. The method 500 can be implemented at the terminal device 120 shown in FIG. 1. For the purpose of discussion, the method 500 will be described with reference to FIG. 1. It is to be understood that method 500 may further include additional blocks not shown and/or omit some shown blocks, and the scope of the present disclosure is not limited in this regard.

As shown in FIG. 5, at block 510, the terminal device 120 receives, from the network device 110, CSI-RSs associated with first number of ports at the network device 110. In some embodiments, the terminal device 120 may receive compressed CSI-RSs. In this case, the first number of ports may less than the total number of ports at the network device 110. In some embodiments, the terminal device 120 may receive the compressed CSI-RSs generated based on antenna characteristics at the network device 110. For example, the compressed CSI-RS may be generated according to the above equations (1)-(3). More details may refer to similar description given in connection with block 310 of FIG. 3.

In some alternative embodiments, the terminal device 120 may receive original or non-processed CSI-RSs. In this case, the first number of ports may equal to the total number of ports at the network device 110. In these embodiments, the terminal device 120 may further receive, from the network device 110, information about transmit compression so as to be later utilized for compression of CSI. For example, the terminal device 120 may receive information about transmit compression matrix F. It should be noted that any other suitable forms of information about transmit compression also can be used.

At block 520, the terminal device 120 determines CSI based on the CSI-RSs. According to embodiments of the present disclosure, the terminal device 120 may determine CSI associated with the first number of ports by channel estimation of the CSI-RSs. It should be noted that the determination of CSI can be carried out in any suitable ways and the present disclosure does not make limitation for this.

At block 530, the terminal device 120 compresses the CSI based on capability of the terminal device 120. In some embodiments, the terminal device may determine a mode of the compression and compress the CSI based on the mode. As described above, in some embodiments, the mode of compression of the compressed CSI may be divided into a first compression mode that is ML friendly with a common codebook and a second compression mode that is not ML friendly with a common codebook. Different compressions are adopted for different modes for facilitating recovery of CSI at the network device 110. It will be described below in connection with FIG. 6.

Figure 6:
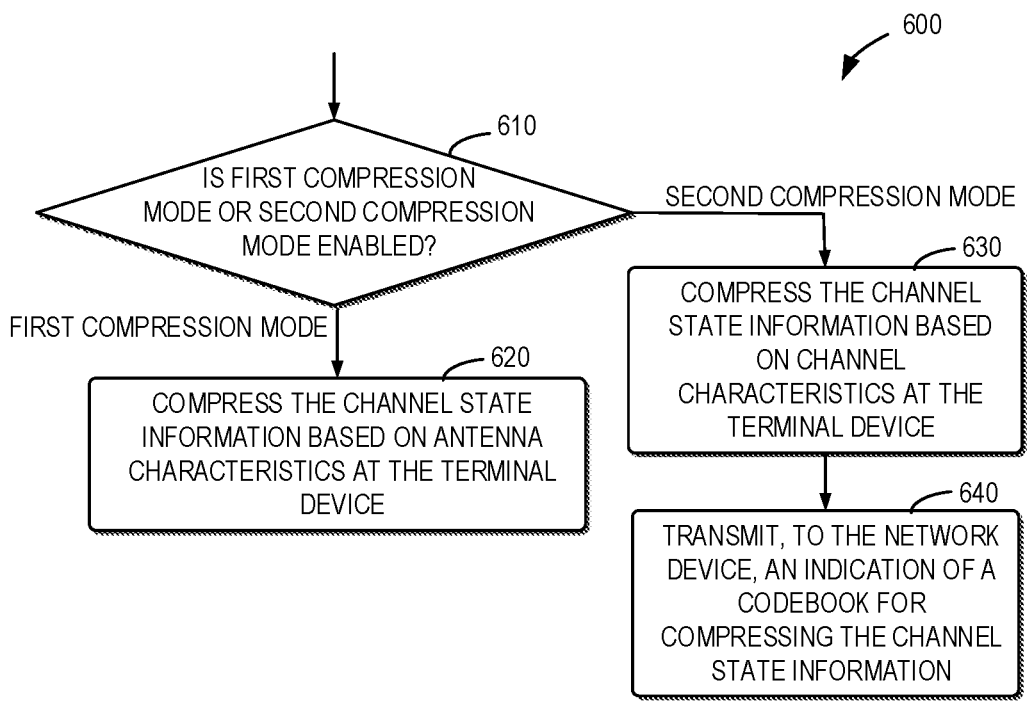
FIG. 6 illustrates a flowchart of an example method of CSI feedback according to example embodiments of the present disclosure.

FIG. 6 illustrates a flowchart of an example method 600 of CSI feedback according to example embodiments of the present disclosure. The method 600 can be implemented at the terminal device 120 shown in FIG. 1. For the purpose of discussion, the method 600 will be described with reference to FIG. 1. It is to be understood that method 600 may further include additional blocks not shown and/or omit some shown blocks, and the scope of the present disclosure is not limited in this regard.

At block 610, the terminal device 120 may determine whether first or second compression mode is enabled. In some embodiments, the mode may be decided or triggered by the network device 110. In this case, the terminal device 120 may transmit information about capability of the terminal device 120 to the network device 110 for determination of the mode. Correspondingly, the terminal device 120 may receive an indicator representing the mode from the network device 110 and determine the mode based on the indicator. For example, in some embodiments, the terminal device 120 may receive the indicator in a PDCCH. In some embodiments, the terminal device 120 may receive the indicator together with the CSI-RSs. It should be noted that the reception of the indicator from the network device 110 can be carried out in any other suitable ways and does not limited by the above example.

In some alternative embodiments, the mode may be decided or triggered by the terminal device 120. In some embodiments, the terminal device 120 may determine the mode based on capability of the terminal device 120. For example, in some embodiments where the terminal device 120 enables the first compression mode, the terminal device 120 may determine the mode as the first compression mode. In some embodiments where the terminal device 120 does not enable the first compression mode, the terminal device 120 may determine the mode as the second compression mode.

In these embodiments where the mode is decided by the terminal device 120, the terminal device 120 may further transmit an indicator representing the mode to the network device 110 for CSI recovery. For example, in some embodiments, the terminal device 120 may transmit the indicator in a PUCCH. In some embodiments, the terminal device 120 may transmit the indicator together with the CSI feedback. It should be noted that the transmission of the indicator from the terminal device 120 can be carried out in any other suitable ways and does not limited by the above example.

With reference to FIG. 6, if determining, at block 610, that the first compression mode is enabled, the terminal device 120 may, at block 620, compress the CSI based on antenna characteristics at the terminal device 120. For example, in some embodiments, UE applies receive compression to further reduce the CSI feedback overhead. The resulting compressed CSI can be denoted by $$y^{(k)} \triangleq$$

where $Y^{(k)}$ represents the compressed CSI associated with $k_{th}$ terminal device, $W^{(k)}$ represents the receive compression matrix associated with $k_{th}$ terminal device, $H^{(k)}$ represents the exact channel matrix associated with $k_{th}$ terminal device, F represents the transmit compression matrix, $N_{R_k}$ represents the number of receive antenna ports at the terminal device 120 and $N_T$ represents the number of CSI-RSs.

In some embodiments where the first compression mode is enabled, the terminal device 120 may apply "static" beamspace compression that matches its array response in the range of interest. Similarly to equation (1), based on the semi-definite matrix of DPSS defined by $$J^{UE} = \int_\Theta \int_\Phi a_{UE}(\vartheta, \varphi) a_{UE}^H(\vartheta, \varphi) d\vartheta d\varphi, \qquad (7)$$

where $a_{UE}(\theta, \varphi)$ represents the array response at the sampling point $(\theta, \varphi)$ for each terminal device 120. The EVD is applied on this matrix $J^{UE} = U\Sigma U^H$ and the compression matrix $W^{(k)}$ can be obtained by taking its dominant eigenvectors as below $$W(k) = U^H(:, 1:N_{R_k}) \qquad (8)$$

This ensures a good array gain in the region of interest and does not depend on the varying channel.

In some embodiments, a common codebook may be defined, into which the $W^{(k)}$ can map. Since the design of $W^{(k)}$ follows the criterion of "to maximize the effective array gain in the angular region of interest" and is "static" (not channel/time-varying dependent), $W^{(k)}$ may be obtained for each terminal device's antenna configurations. A codebook is required to represent $W^{(k)}$ well. In some embodiments, different terminal devices may have different $W^{(k)}$ but for each terminal device the $W^{(k)}$ is fixed according to its own pattern.

In some embodiments, the common codebook may be designed to fit different number of antenna elements. Since a terminal device may not have many antennas, the size of the common codebook would not be large. Accordingly, the choices of the codebook that matched to $W^{(k)}$ would not be large, either.

In some embodiments where the non-compressed CSI-RS is received, the terminal device 120 may determine, based on the received information about the transmit compression (for example transmit compression matrix F), the receive compression matrix $W^{(k)}$, for example, according to equations (7) and (8). The resulting compressed CSI may be written by $$Y^{(k)} = W^{(k)} HF. \qquad (9)$$

where $Y^{(k)}$ represents the compressed CSI, $W^{(k)}$ represents the receive compression matrix, H represents the exact channel matrix, and F represents the transmit compression matrix.

It should be note that the above-listed equations are provided merely for illustration, and are not intended to limit the present application, and any other suitable implementations can be adopted.

With reference to FIG. 6, if determining, at block 610, that the second compression mode is enabled, the terminal device 120 may, at block 630, compress the CSI based on channel propagation characteristics at the terminal device 120. In some embodiments, the terminal device 120 may compress the CSI in the spatial domain by applying a dynamic channel dependent scheme. For example, based on the estimated channel, the terminal device 120 may figure out the significant components and aligns them with the pre-defined codebook such as DFT codebook. This scheme ensures that the terminal device 120 selects the compression matrix from the codebook to maximize the effective array gain during the reception, which is dynamic and depends on CSI.

In some embodiments where the second compression mode is enabled, at block 640, the terminal device 120 may transmit, to the network device 110, an indication of the codebook for compressing the CSI, so as to be used by the network device 110 for CSI recovery. In some embodiments, the terminal device 120 may transmit, to the network device 110, the indication of the codebook together with the compressed CSI. In some alternative embodiments, the terminal device 120 may separately transmit the indication of the codebook to the network device 110. Comparing with the second compression mode, in the first compression mode, it is not needed to estimate the channel information for obtaining receive compression matrix $W^{(k)}$, and thus a reduced complexity can be achieved at the terminal device.

Returning to FIG. 5, at block 540, the terminal device 120 transmits the compressed CSI to the network device 110 for recovery of CSI associated with second number of ports at the network device 110, the second number of ports being not less than the first number of ports. In this way, CSI compression based on capability of the terminal device 120 can facilitate recovery of CSI of the uncompressed dimension from the compressed CSI associated with a limited number of ports.

With the solution of the present disclosure, it takes advantages of deep neural network, which inherently explores the spatial sparsity of the mmWave massive MIMO channels, to enable the enhanced CSI recovery of more ports than the number of ports fed back. Further, the CSI compression is split at both the network device and the terminal device. It is simple to be implemented, since the transmit compression is static without much CSI knowledge and the terminal device also does not need to have complicated compression as in the OMP based solution.

In addition, compared to the non-precoded case, the present solution can reduce the CSI-RS overhead. Compared to the beamformed case, the present solution has a higher flexibility to design the transmit precoding, which is not split into beams and "second-stage" precoding. Accordingly, it can also support a larger number of transmit layers. Furthermore, the present solution does not require the CRI feedback. The proposed scheme is flexible to support different modes of the CSI compression according to different terminal device's capabilities.

The inventor summarizes the differences of the present solution from the existing solutions as shown in Table 1.

TABLE 1

Comparison with the Existing Solutions

| Schemes | CSI-RS (ports) | Measured CSI @ UE | CSI Feed-back | Pre-coding/CSI | Max. # of layers |
|---|---|---|---|---|---|
| Non-precoded CSI-RS and Compressed CSI | non-precoded ($M_T$) | $H \in \mathbb{C}^{M_R \times M_T}$ | $h_{comp}$ | F from H | $M_T$ |
| Beamformed CSI-RS and non-compressed CSI | BFed ($N_p$) | $H^{BF} \in \mathbb{C}^{M_R \times N_p}$ | $H^{BF}$ & CRI | $F_L$ from $H^{BF}$ | $N_p$ |
| Beamformed CSI-RS and compressed CSI | BFed ($N_p$) | $H^{BF} \in \mathbb{C}^{M_R \times N_p}$ | $H_{comp}^{BF}$ & CRI | $F_L$ from $H^{BF}$ | $N_p$ |

TABLE 1-continued

Comparison with the Existing Solutions

| Schemes | CSI-RS (ports) | Measured CSI @ UE | CSI Feedback | Precoding/ CSI | Max. # of layers |
|---|---|---|---|---|---|
| Proposed solution | Compressed ($N_T$) | $H_{comp}^{TRx} \in C^{MR_k N_T}$ (Mode 0) $H_{comp}^{Tx} \in C^{MR_k N_T}$ (Mode 1) | $H_{comp}^{TRx}$ | F from H | $M_T$ |

The inventor performs simulations by considering a mmWave multi-user MIMO system. The simulation setup is shown in Table 2.

TABLE 2

Simulation Setup
Simulation Parameters (Single-cell)

| Channel model | Clustered channel model |
|---|---|
| Number of clusters | 1 |
| Number of rays per cluster | 2 |
| Channel gain | Complex Normal distribution |
| Azimuth & Elevation angles | Laplacian distribution |
| Carrier frequency | 28 GHz |
| Array @ BS/# of RF chains | 32 Ports (ULA) |
| Array @ UE | 4 (ULA) |

In the simulation, the deep convolutional neural network (CNN) is implemented by MATLAB2018a. 4 CNN units are considered and in the convolutional layer filters with $L_f$=[8, 16, 31, 64] for the consecutive units are applied, respectively. The fully-connected layer after the concatenated CNN units has the number of neurons the same as the size of the output. The total data set includes 50000 samples, where 85% is used for training and the rest for validation. The training rate is 0.0002 with a gradient drop rate 0.9. The mini-batch size of 2048 for the gradient descent is used.

The inventor evaluates the proposed schemes for both the first compression mode (Mode 0) and second compression mode (Mode 1), using different compression values, and compare with the OMP based algorithm as well as the perfect case. The compression value of the proposed scheme is 8 (out of 32, the number of transmit antenna ports) for the transmitter and 1 or 2 (out of 4 the number of receive antennas), i.e., 8 or 16 out of 128. For the OMP method, due to the iterative algorithm, the compression value varies with different channel realizations. The stopping criterion is adjusted so that the average compression value is comparable to our proposed method, which has two cases 9 and 17, out of 128. The smaller compression value indicates a higher compression ratio.

Figure 7:
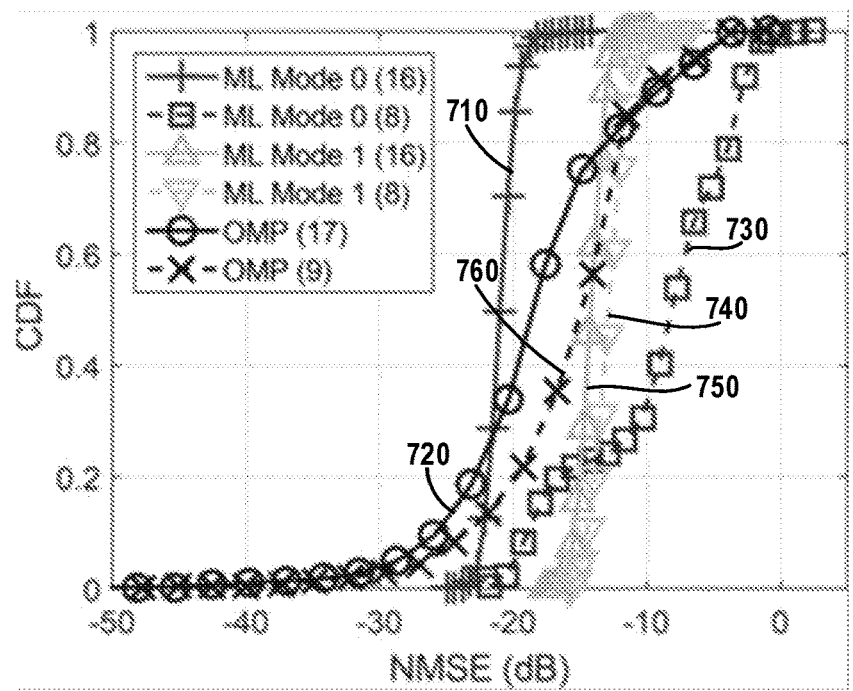
FIG. 7 illustrates an example comparison of normalized mean square error (NMSE) performance between the present solution and existing solutions through a cumulative distribution function (CDF)

FIG. 7 illustrates an example comparison 700 of NMSE performance between the present solution and existing solutions through a CDF. As shown in FIG. 7, 710 denotes Mode 0 case with compression value 16 in the present solution, 720 denotes OMP case with compression value 17 in the existing solution, 730 denotes Mode 0 case with compression value 8 in the present solution, 740 denotes Mode 1 case with compression value 8 in the present solution, 750 denotes Mode 0 case with compression value 16 in the present solution, and 760 denotes OMP case with compression value 9 in the existing solution.

It is observed that the Mode 0 with compression value 16 achieves the best performance, which is better than the Mode 1. While the performance of Mode 0 with value 8 does not outperform that of Mode 1, since its static beamspace compression with a smaller compression value may lose its adaptivity but may be sufficient if compression value is high. In Mode 1, the compression at the terminal device varies with the channel, which is dynamic. Thus the performance is more stable for Mode 1. The inventor also evaluates the OMP based method with different compression values. The performance slightly outperforms Mode 1.

Figure 8:
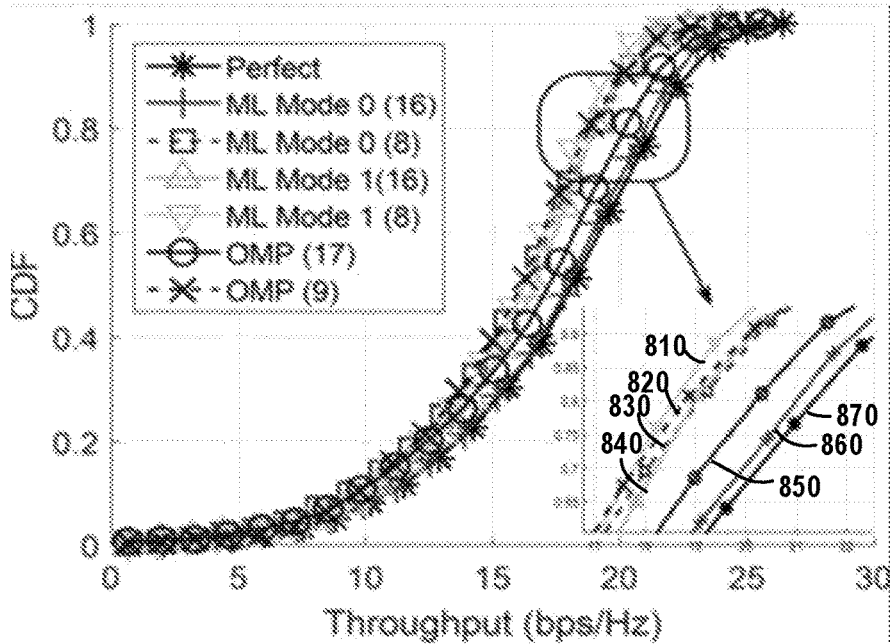
FIG. 8 illustrates an example comparison of throughput performance between the present solution and existing solutions through a CDF.

FIG. 8 illustrates an example comparison 800 of throughput performance between the present solution and existing solutions through a CDF. The inventor analysis the throughput performance as a function of the number of users using different CSI acquisition schemes, assuming that SNR is 15 dB and 2 users are considered. As shown in FIG. 8, 810 denotes Mode 1 case with compression value 8 in the present solution, 820 denotes OMP case with compression value 9 in the existing solution, 830 denotes Mode 0 case with compression value 8 in the present solution, 840 denotes Mode 1 case with compression value 16 in the present solution, 850 denotes OMP case with compression value 17 in the existing solution, 860 denotes Mode 0 case with compression value 16 in the present solution, and 870 denotes the perfect case. It can be observed that the proposed scheme in Mode 0 outperforms that in Mode 1 and the OMP scheme with the similar compression value.

Figure 9:
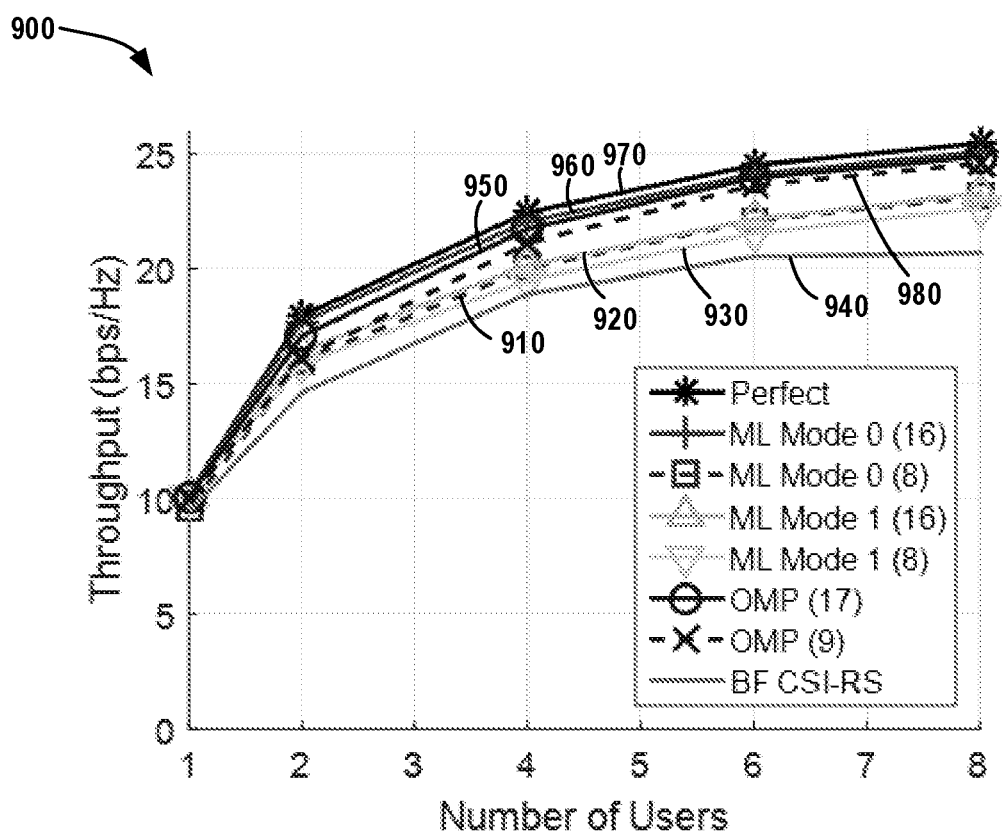
FIG. 9 illustrates an example comparison of throughput performance versus the number of terminal devices between the present solution and existing solutions through a CDF.

FIG. 9 illustrates an example comparison of throughput performance versus the number of terminal devices between the present solution and existing solutions through a CDF, assuming that SNR is 15 dB. As shown in FIG. 9, 910 denotes Mode 0 case with compression value 8 in the present solution, 920 denotes Mode 1 case with compression value 16 in the present solution, 930 denotes Mode 1 case with compression value 8 in the present solution, 940 denotes the beamformed CSI-RS case, 950 denotes OMP case with compression value 17 in the existing solution, 960 denotes Mode 0 case with compression value 16 in the present solution, 970 denotes the perfect case, and 980 denotes OMP case with compression value 9 in the existing solution.

It exhibits similar results when a different number of users are considered. It also considers the beamformed CSI-RS case, where the DFT based codebook is used for the beamforming processing. The performance loss is because of the split "two-stage" precoding, where the "first-stage" is the beamforming for CSI-RS and the "second-stage" precoding is designed based on the beamformed CSI.

In addition, the inventor performs the overhead analysis. The main overhead in the system is determined by the CSI-RS and the CSI feedback as shown in Table 3. The overhead of transmitting CSI-RS depends on the number of transmitted CSI-RS and thus the number of transmit antenna ports. For the proposed scheme, since there is transmit compression, the overhead of the CSI-RS is $O(N_T)$ and in our example $N_T$=8. For the OMP method, no transmit compression is carried out and thus the overhead scales with $M_T$ and in our example is $M_T$=32. For the overhead of CSI feedback, with the quantization bits being denoted by Q, the number of CSI feedback bits for the proposed scheme can be calculated by $2QN_T N_{R_k}$, where $N_T N_{R_k}$ is the compression value. In this example, it is 2Q·8 or 2Q·16. The OMP based scheme in the simulation requires 2Q·9 or 2Q·17 with L=9 or 17. Furthermore, in the proposed method for Mode 1 and the OMP based scheme, it is also required to feedback the indices of the compression matrices. The compression matrix is usually selected from a codebook, whose size is determined by the number of antennas. The proposed Mode 1 needs $N_{R_k} \log_2(M_{R_k})$ bits to feedback the indices of the codebook, which is 1 or 2 bits in our example. For the OMP algorithm, it requires L log$_2$ (M$_T$M$_{R_k}$) bits for feeding back indices, which needs 1·log$_2$ (32·4)=7 bits.

TABLE 2

Overhead Analysis

| | Overhead of CSI-RS | CSI Feedback Bits | Codebook Indications for Reconstruction |
|---|---|---|---|
| Proposed Mode 0 case | O(N$_T$) | 2QN$_T$N$_{R_k}$ | 0 |
| Proposed Mode 1 case | O(N$_T$) | 2QN$_T$N$_{R_k}$ | N$_{R_k}$ log$_2$(M$_{R_k}$) |
| OMP based case | O(M$_T$) | 2QL | Llog$_2$(M$_T$M$_{R_k}$) |

Based on the calculation, the overhead analysis of the considered schemes in our case is shown in Table 4. It is observed that the proposed scheme significantly reduces the overhead of both the CSI-RS and the codebook indications.

TABLE 3

Overhead Analysis and comparison for different schemes

| Schemes | CSI-RS Overhead | CSI Feedback (bits) | Codebook Indications for Reconstruction (bits) |
|---|---|---|---|
| Mode 0 (8) | O(8) | 16 Q | 0 |
| Mode 0 (16) | O(8) | 32 Q | 0 |
| Mode 1 (8) | O(8) | 16 Q | 2 |
| Mode 1 (16) | O(8) | 32 Q | 4 |
| OMP(17) | O(32) | 34 Q | 119 |
| OMP (9) | O(32) | 18 Q | 63 |

To conclusion, according to the performance in terms of estimation error, throughput, as well as overhead, it can be concluded that the proposed ML based CSI recovery method from limited CSI feedback shows a good performance and reduces the overhead of both the CSI-RS and CSI feedback.

In some embodiments, an apparatus (for example, the network device 110) capable of performing the method 300 may comprise means for performing the respective steps of the method 300. The means may be implemented in any suitable form. For example, the means may be implemented in a circuitry or software module.

In some embodiments, the apparatus may comprises: means for transmitting, at a network device and to a terminal device, channel state information reference signals associated with first number of ports at the network device; means for receiving, from the terminal device, compressed channel state information generated based on capability of the terminal device; and means for recovering, from the compressed channel state information, channel state information associated with second number of ports at the network device, the second number of ports being not less than the first number of ports.

In some embodiments, the means for transmitting may comprises: means for compressing original channel state information reference signals associated with the second number of ports into the channel state information reference signals associated with the first number of ports at the network device; and means for transmitting the compressed channel state information reference signals to the terminal device.

In some embodiments, the means for recovering comprises: means for determining whether a mode of the compression of the channel state information is a first compression mode in which the compression is performed based on antenna characteristics at the terminal device; and means for recovering the channel state information based on a first predetermined model mapping the compressed channel state information to the channel state information, in accordance with a determination that the mode of the compression of the channel state information is the first compression mode.

In some embodiments, the apparatus further comprises: means for receiving, from the terminal device, an indication of a codebook for compressing the channel state information. In some embodiments, the means for recovering comprises: means for determining whether a mode of the compression of the channel state information is a second compression mode in which the compression is performed based on channel propagation characteristics at the terminal device; and means for generating, based on the codebook, processed channel state information, and recovering the channel state information based on a second predetermined model mapping the processed channel state information to the channel state information, in accordance with a determination that the mode of the compression of the channel state information is the second compression mode.

In some embodiments, the apparatus further comprises: means for in according with that a mode of compression of the compressed channel state information is decided by the network device, transmitting, to the terminal device, an indicator representing the mode; and means for in according with that the mode of compression of the compressed channel state information is decided by the terminal device, receiving, from the terminal device, an indicator representing the mode. In some additional embodiments, the means for recovering comprises: means for recovering the channel state information based on the mode.

In some embodiments, an apparatus (for example, the terminal device 120) capable of performing the method 500 may comprise means for performing the respective steps of the method 500. The means may be implemented in any suitable form. For example, the means may be implemented in a circuitry or software module.

In some embodiments, the apparatus may comprise: means for receiving, at a terminal device and from a network device, channel state information reference signals associated with first number of ports at the network device; means for determining channel state information based on the channel state information reference signals; means for compressing the channel state information based on capability of the terminal device; and means for transmitting the compressed channel state information to the network device for recovery of channel state information associated with a second number of ports at the network device, the second number of ports being not less than the first number of ports.

In some embodiments, the means for receiving comprises: means for receiving, from the network device, compressed channel state information reference signals associated with the first number of ports, the compressed channel state information reference signals associated with the first number of ports being generated from original channel state information reference signals associated with the second number of ports.

In some embodiments, the means for compressing comprises: means for determining whether the terminal device enables a first compression mode; and means for compressing the channel state information based on antenna characteristics at the terminal device in accordance with a determination that the terminal device enables the first compression mode.

In some embodiments, the means for compressing comprises: means for determining whether the terminal device enables a second compression mode; and means for compressing the channel state information based on channel propagation characteristics at the terminal device in accordance with a determination that the terminal device enables the second compression mode. In some additional embodiments, the apparatus further comprises: means for transmitting, to the network device, an indication of a codebook for compressing the channel state information.

In some embodiments, the apparatus further comprises: means for in according with that a mode of compression of the compressed channel state information is decided by the terminal device, transmitting, to the network device, an indicator representing the mode; and means for in according with that a mode of compression of the compressed channel state information is decided by the network device, receiving, from the network device, an indicator representing the mode. In some additional embodiments, the means for compressing comprises: means for compressing the channel state information based on the mode.

Figure 10:
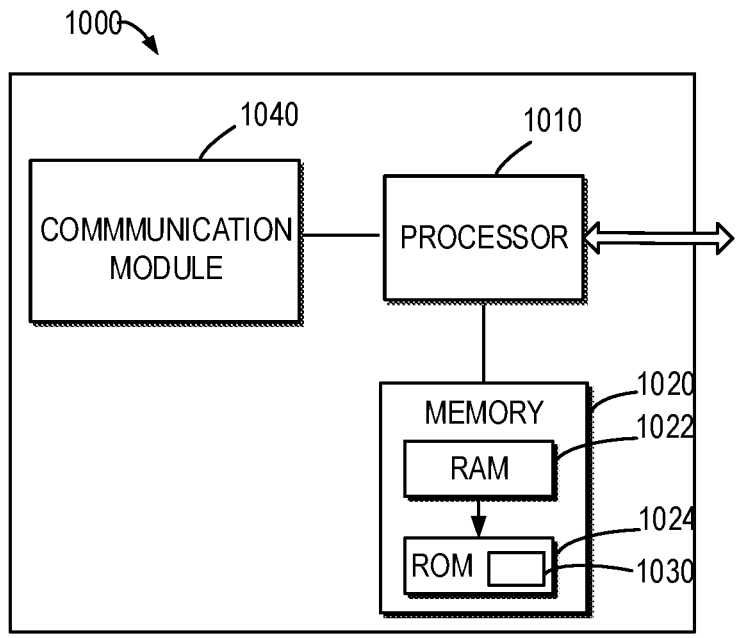
FIG. 10 illustrates a simplified block diagram of an apparatus that is suitable for implementing example embodiments of the present disclosure.

FIG. 10 is a simplified block diagram of a device 1000 that is suitable for implementing embodiments of the present disclosure. The device 1000 may be provided to implement the network device or terminal device, for example the network device 110 or terminal device 120 as shown in FIG. 1. As shown, the device 1000 includes one or more processors 1010, one or more memories 1020 coupled to the processor 1010, and one or more communication modules 1040 (such as, transmitters and/or receivers) coupled to the processor 1010.

The communication module 1040 is for bidirectional communications. The communication module 1040 has at least one antenna to facilitate communication. The communication interface may represent any interface that is necessary for communication with other network elements.

The processor 1010 may be of any type suitable to the local technical network and may include one or more of the following: general purpose computers, special purpose computers, microprocessors, digital signal processors (DSPs) and processors based on multicore processor architecture, as non-limiting examples. The device 1000 may have multiple processors, such as an application specific integrated circuit chip that is slaved in time to a clock which synchronizes the main processor.

The memory 1020 may include one or more non-volatile memories and one or more volatile memories. Examples of the non-volatile memories include, but are not limited to, a Read Only Memory (ROM) 1024, an electrically programmable read only memory (EPROM), a flash memory, a hard disk, a compact disc (CD), a digital video disk (DVD), and other magnetic storage and/or optical storage. Examples of the volatile memories include, but are not limited to, a random access memory (RAM) 1022 and other volatile memories that will not last in the power-down duration.

A computer program 1030 includes computer executable instructions that are executed by the associated processor 1010. The program 1030 may be stored in the ROM 1024. The processor 1010 may perform any suitable actions and processing by loading the program 1030 into the RAM 1022.

The embodiments of the present disclosure may be implemented by means of the program 1030 so that the device 1000 may perform any process of the disclosure as discussed with reference to FIGS. 3 to 6. The embodiments of the present disclosure may also be implemented by hardware or by a combination of software and hardware.

Figure 11:
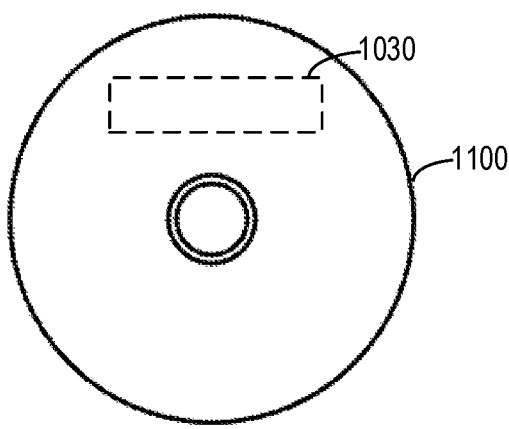
FIG. 11 illustrates a block diagram of an example computer readable medium in accordance with example embodiments of the present disclosure.

In some embodiments, the program 1030 may be tangibly contained in a computer readable medium which may be included in the device 1000 (such as in the memory 1020) or other storage devices that are accessible by the device 1000. The device 1000 may load the program 1030 from the computer readable medium to the RAM 1022 for execution. The computer readable medium may include any types of tangible non-volatile storage, such as ROM, EPROM, a flash memory, a hard disk, CD, DVD, and the like. FIG. 11 shows an example of the computer readable medium 1100 in form of CD or DVD. The computer readable medium has the program 1030 stored thereon.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representations, it is to be understood that the block, apparatus, system, technique or method described herein may be implemented in, as non-limiting examples, hardware, software, firmware, special purpose circuits or logic, general purpose hardware or controller or other computing devices, or some combination thereof.

The present disclosure also provides at least one computer program product tangibly stored on a non-transitory computer readable storage medium. The computer program product includes computer-executable instructions, such as those included in program modules, being executed in a device on a target real or virtual processor, to carry out the methods 300-600 as described above with reference to FIGS. 3-6. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of the present disclosure, the computer program codes or related data may be carried by any suitable carrier to enable the device, apparatus or processor to perform various processes and operations as described above. Examples of the carrier include a signal, computer readable medium, and the like.

The computer readable medium may be a computer readable signal medium or a computer readable storage medium. A computer readable medium may include but not limited to an electronic, magnetic, optical, electromagnetic, infrared, or semiconductor system, apparatus, or device, or any suitable combination of the foregoing. More specific examples of the computer readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in languages specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A method of communication, comprising:
    transmitting, at a network device and to a terminal device, channel state information reference signals associated with first number of ports at the network device;
    receiving, from the terminal device, compressed channel state information generated based on capability of the terminal device; and
    recovering, from the compressed channel state information, channel state information associated with second number of ports at the network device, the second number of ports being not less than the first number of ports.

2. The method of claim 1, wherein the transmitting comprises:
    compressing original channel state information reference signals associated with the second number of ports into the channel state information reference signals associated with the first number of ports at the network device; and
    transmitting the compressed channel state information reference signals to the terminal device.

3. The method of claim 1, wherein the recovering comprises:
    determining whether a mode of the compression of the channel state information is a first compression mode in which the compression is performed based on antenna characteristics at the terminal device; and
    in accordance with a determination that the mode of the compression of the channel state information is the first compression mode, recovering the channel state information based on a first predetermined model mapping the compressed channel state information to the channel state information.

4. The method of claim 1, further comprising:
    receiving, from the terminal device, an indication of a codebook for compressing the channel state information, and
    wherein the recovering comprises:
        determining whether a mode of the compression of the channel state information is a second compression mode in which the compression is performed based on channel propagation characteristics at the terminal device; and
        in accordance with a determination that the mode of the compression of the channel state information is the second compression mode,
            generating, based on the codebook, processed channel state information; and
            recovering the channel state information based on a second predetermined model mapping the processed channel state information to the channel state information.

5. The method of claim 1, further comprising:
    in accordance with a mode of compression of the compressed channel state information being decided by the network device, transmitting, to the terminal device, an indicator representing the mode; and
    in accordance with the mode of compression of the compressed channel state information being decided by the terminal device, receiving, from the terminal device, an indicator representing the mode, and
    wherein the recovering comprises:
        recovering the channel state information based on a predetermined model associated with the mode, the predetermined model mapping the compressed channel state information to the channel state information.

6. A method of communication comprising:
    receiving, at a terminal device and from a network device, channel state information reference signals associated with first number of ports at the network device;
    determining channel state information based on the channel state information reference signals;
    compressing the channel state information based on capability of the terminal device; and
    transmitting the compressed channel state information to the network device for recovery of channel state information associated with a second number of ports at the network device, the second number of ports being not less than the first number of ports.

7. The method of claim 6, wherein the receiving comprises:
    receiving, from the network device, compressed channel state information reference signals associated with the first number of ports, the compressed channel state information reference signals associated with the first number of ports being generated from original channel state information reference signals associated with the second number of ports.

8. The method of claim 6, wherein the compressing comprises:
    determining whether the terminal device enables a first compression mode; and
    in accordance with a determination that the terminal device enables the first compression mode, compressing the channel state information based on antenna characteristics at the terminal device.

9. The method of claim 6, wherein the compressing comprises:
   determining whether the terminal device enables a second compression mode; and
   in accordance with a determination that the terminal device enables the second compression mode, compressing the channel state information based on channel propagation characteristics at the terminal device, and
   the method further comprising:
      transmitting, to the network device, an indication of a codebook for compressing the channel state information.

10. The method of claim 6, further comprising:
   in accordance with a mode of compression of the compressed channel state information being decided by the terminal device, transmitting, to the network device, an indicator representing the mode; and
   in accordance with a mode of compression of the compressed channel state information being decided by the network device, receiving, from the network device, an indicator representing the mode, and
   wherein the compressing comprises:
      compressing the channel state information based on the mode.

11. A network device, comprising:
   at least one processor; and
   at least one memory including computer program code;
   the at least one memory and the computer program code are configured to, with the at least one processor, cause the network device to:
      transmit, at the network device and to a terminal device, channel state information reference signals associated with first number of ports at the network device;
      receive, from the terminal device, compressed channel state information generated based on capability of the terminal device; and
      recover, from the compressed channel state information, channel state information associated with second number of ports at the network device, the second number of ports being not less than the first number of ports.

12. The network device of claim 11, wherein the network device is caused to transmit the channel state information reference signals by:
   compress original channel state information reference signals associated with the second number of ports into the channel state information reference signals associated with the first number of ports at the network device; and
   transmit the compressed channel state information reference signals to the terminal device.

13. The network device of claim 11, wherein the network device is caused to recover the channel state information by:
   determining whether a mode of the compression of the channel state information is a first compression mode in which the compression is performed based on antenna characteristics at the terminal device; and
   in accordance with a determination that the mode of the compression of the channel state information is the first compression mode, recovering the channel state information based on a first predetermined model mapping the compressed channel state information to the channel state information.

14. The network device of claim 11, wherein the network device is further caused to:
   receive, from the terminal device, an indication of a codebook for compressing the channel state information, and
   wherein the network device is caused to recover the channel state information by:
      determining whether a mode of the compression of the channel state information is a second compression mode in which the compression is performed based on channel propagation characteristics at the terminal device; and
      in accordance with a determination that the mode of the compression of the channel state information is the second compression mode,
      generating, based on the codebook, processed channel state information; and
      recovering the channel state information based on a second predetermined model mapping the processed channel state information to the channel state information.

15. The network device of claim 11, wherein the network device is further caused to:
   in accordance with a mode of compression of the compressed channel state information being decided by the network device, transmit, to the terminal device, an indicator representing the mode; and
   in accordance with the mode of compression of the compressed channel state information being decided by the terminal device, receive, from the terminal device, an indicator representing the mode, and
   wherein the network device is caused to recover the channel state information by:
      recovering the channel state information based on a predetermined model associated with the mode, the predetermined model mapping the compressed channel state information to the channel state information.

16. A terminal device, comprising:
   at least one processor; and
   at least one memory including computer program code;
   the at least one memory and the computer program code are configured to, with the at least one processor, cause the terminal device to:
      receive, at the terminal device and from a network device, channel state information reference signals associated with first number of ports at the network device;
      determine, based on the channel state information reference signals, channel state information;
      compress the channel state information based on capability of the terminal device; and
      transmit the compressed channel state information to the network device for recovery of channel state information associated with a second number of ports at the network device, the second number of ports being not less than the first number of ports.

17. The terminal device of claim 16, wherein the terminal device is caused to receive the channel state information reference signals by:
   receiving, from the network device, compressed channel state information reference signals associated with the first number of ports, the compressed channel state information reference signals associated with the first number of ports being generated from original channel state information reference signals associated with the second number of ports.

18. The terminal device of claim 16, wherein the terminal device is caused to compress the channel state information by:

determining whether the terminal device enables a first compression mode; and in accordance with a determination that the terminal device enables the first compression mode, compressing the channel state information based on antenna characteristics at the terminal device.

19. The terminal device of claim 16, wherein the terminal device is caused to compress the channel state information by:

determining whether the terminal device enables a second compression mode; and in accordance with a determination that the terminal device enables the second compression mode, compressing the channel state information based on channel propagation characteristics at the terminal device, and wherein the terminal device is further caused to:

transmit, to the network device, an indication of a codebook for compressing the channel state information.

20. The terminal device of claim 16, wherein the terminal device is further caused to:

in accordance with a mode of compression of the compressed channel state information being decided by the terminal device, transmit, to the network device, an indicator representing the mode; and in accordance with a mode of compression of the compressed channel state information being decided by the network device, receive, from the network device, an indicator representing the mode, and wherein the terminal device is caused to compress the channel state information by:

compressing the channel state information based on the mode.

21. A non-transitory computer readable medium comprising program instructions for causing an apparatus to perform the method according to claim 1.

22. A non-transitory computer readable medium comprising program instructions for causing an apparatus to perform the method according to claim 6.

* * * * *